United States Patent
Tseng et al.

(10) Patent No.: US 9,490,118 B2
(45) Date of Patent: Nov. 8, 2016

(54) METHOD FOR MANUFACTURING GERMANIUM EPITAXIAL LAYER AND METHOD FOR MANUFACTURING DEVICE USING THE SAME

(71) Applicant: UNITED MICROELECTRONICS CORP., Hsin-Chu (TW)

(72) Inventors: Jaw-Jyh Tseng, Hsinchu (TW); Chun-Ming Chen, Hsinchu (TW); Yao-Yi Huang, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/642,778

(22) Filed: Mar. 10, 2015

(65) Prior Publication Data

US 2016/0233086 A1    Aug. 11, 2016

(30) Foreign Application Priority Data

Feb. 9, 2015 (TW) .............................. 104104277 A

(51) Int. Cl.
*H01L 21/36* (2006.01)
*H01L 21/02* (2006.01)
*H01L 21/324* (2006.01)

(52) U.S. Cl.
CPC ..... *H01L 21/02532* (2013.01); *H01L 21/0242* (2013.01); *H01L 21/02381* (2013.01); *H01L 21/02422* (2013.01); *H01L 21/02639* (2013.01); *H01L 21/324* (2013.01)

(58) Field of Classification Search
CPC .................. H01L 21/02532; H01L 21/02381; H01L 21/0242; H01L 21/02422; H01L 21/02639; H01L 21/324
USPC ......................................................... 438/479
See application file for complete search history.

(56) References Cited

U.S. PATENT DOCUMENTS

| | | | |
|---|---|---|---|
| 6,635,110 B1 | 10/2003 | Luan | |
| 7,037,856 B1* | 5/2006 | Maa | H01L 21/02381 257/E21.103 |
| 7,329,593 B2* | 2/2008 | Bauer | C30B 25/10 117/89 |
| 7,510,904 B2* | 3/2009 | Chu | H01L 31/101 257/E21.093 |
| 7,919,381 B2* | 4/2011 | Nayfeh | H01L 21/02381 257/E21.201 |
| 2015/0028443 A1* | 1/2015 | Shi | H01L 31/028 257/438 |

* cited by examiner

*Primary Examiner* — Tod T Van Roy
*Assistant Examiner* — Vu A Vu
(74) *Attorney, Agent, or Firm* — Winston Hsu; Scott Margo

(57) ABSTRACT

A method for manufacturing a germanium (Ge) epitaxial layer is provided. First, a substrate is provided. Then, a first deposition process is performed to deposit a first Ge epitaxial film on the substrate. Next, a first annealing process is performed on the first Ge epitaxial film. Following that, a second deposition process is performed to directly deposit a second Ge epitaxial film on the first Ge epitaxial film. Thereafter, a second annealing process is performed on the second Ge epitaxial film, wherein the Ge epitaxial layer includes the first Ge epitaxial film and the second Ge epitaxial film, and a thickness of the Ge epitaxial layer is greater than 0.5 microns.

19 Claims, 3 Drawing Sheets

METHOD FOR MANUFACTURING GERMANIUM EPITAXIAL LAYER AND METHOD FOR MANUFACTURING DEVICE USING THE SAME

BACKGROUND OF THE INVENTION

1. Field of the Invention

The present invention relates to a method for manufacturing a germanium epitaxial layer and a method for manufacturing a device using the same, and more particularly, to a method for manufacturing a germanium epitaxial layer and a method for manufacturing a device using the same with performing a deposition process and an annealing process alternately at least two times.

2. Description of the Prior Art

Conventional optical devices, such as an avalanche photodiode (APD), which uses germanium to absorb light, can detect a weak light signal or receive a light signal that has traveled a long distance. In the conventional avalanche photodiode, a germanium epitaxial layer is formed on the diode formed by a silicon epitaxial layer and serves as a light absorption layer. When the germanium epitaxial layer absorbs few photons, the avalanche breakdown occurs in the germanium epitaxial layer by applying a reverse bias across the diode, and the photons in the germanium epitaxial layer will generate multiple current. Therefore, the current which represents the light signal can be detected. However, the germanium epitaxial layer in the conventional avalanche photodiode requires a certain thickness, thereby having high defect density. Accordingly, an over high dark current in the avalanche photodiode will be generated, and the accuracy of detection of the avalanche photodiode will also decrease due to the over high defect density.

SUMMARY OF THE INVENTION

It is one of the objectives of the present invention to provide a method for manufacturing a germanium epitaxial layer and a method for manufacturing a device using the same for reducing the amount and the density of the defects in the germanium epitaxial layer, and further reducing the dark current of the device.

To achieve the purpose described above, the present invention provides a method for manufacturing a germanium epitaxial layer. First, a substrate is provided, and then a first deposition process is performed to deposit a first germanium epitaxial film on the substrate. Next, a first annealing process is performed on the first germanium epitaxial film, and a second deposition process is performed afterwards to deposit a second germanium epitaxial film directly on the first germanium epitaxial film. Then, a second annealing process is performed on the second germanium epitaxial film, wherein the germanium epitaxial layer includes the first germanium epitaxial film and the second germanium epitaxial film, and a thickness of the germanium epitaxial layer is greater than 0.5 micrometers.

To achieve the purpose described above, the present invention provides a method for manufacturing a device. First, a substrate is provided. An epitaxial layer is formed on the substrate. Then, a first deposition process is performed to deposit a first germanium epitaxial film on a portion of the epitaxial layer. Next, a first annealing process is performed on the first germanium epitaxial film. Then, a second deposition process is performed to deposit a second germanium epitaxial film directly on the first germanium epitaxial film. Next, a second annealing process is performed on the second germanium epitaxial film, wherein the first germanium epitaxial film and the second germanium epitaxial film form a germanium epitaxial layer, and a thickness of the germanium epitaxial layer is greater than 0.5 micrometers.

In the method for manufacturing the germanium epitaxial layer of the present invention, the germanium epitaxial layer formed by a plurality of the deposition processes and annealing processes alternately can have lower amount and density of the defects as compared to the germanium epitaxial layer formed by single deposition process and single annealing process. Therefore, the dark current of the avalanche photodiode can be lowered and the accuracy of the detection of the avalanche photodiode can be enhanced when the aforementioned germanium epitaxial layer is applied to the avalanche photodiode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
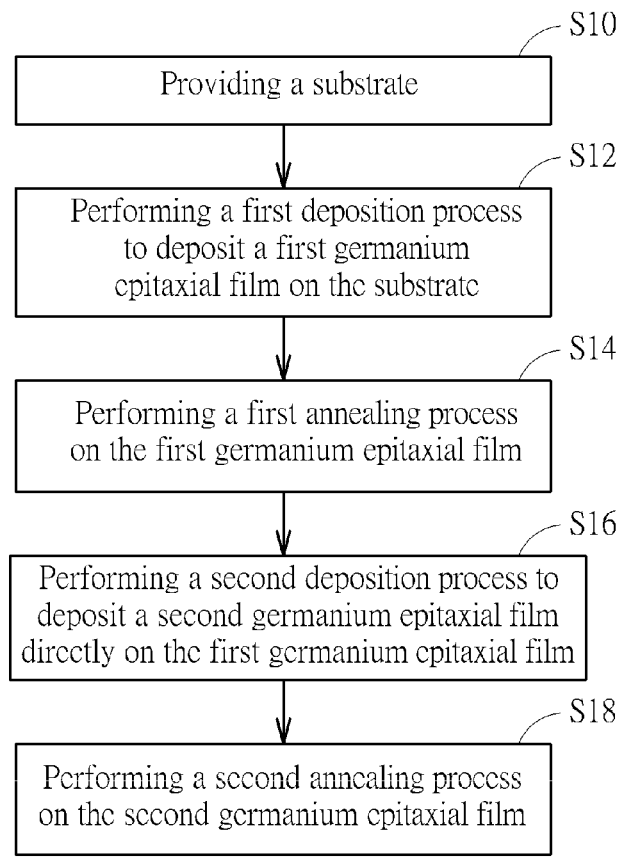
FIG. 1 is a schematic diagram illustrating a process flow of a method for manufacturing a germanium epitaxial layer of the present invention.

Please refer to FIG. 1, which is a schematic diagram illustrating a process flow of a method for manufacturing a germanium epitaxial layer of the present invention. As shown in FIG. 1, the method for manufacturing a germanium epitaxial layer includes following steps:

Step S10: providing a substrate;

Step S12: performing a first deposition process to deposit a first germanium epitaxial film on the substrate;

Step S14: performing a first annealing process on the first germanium epitaxial film;

Step S16: performing a second deposition process to deposit a second germanium epitaxial film directly on the first germanium epitaxial film; and Step S18: performing a second annealing process on the second germanium epitaxial film.

To provide a better understanding of the method for manufacturing the germanium epitaxial layer of the present invention, preferred embodiments will be detailed as follows, the preferred embodiments of the present invention are illustrated in the accompanying drawings, and the manufacturing method is not limited thereto.

Figure 2:
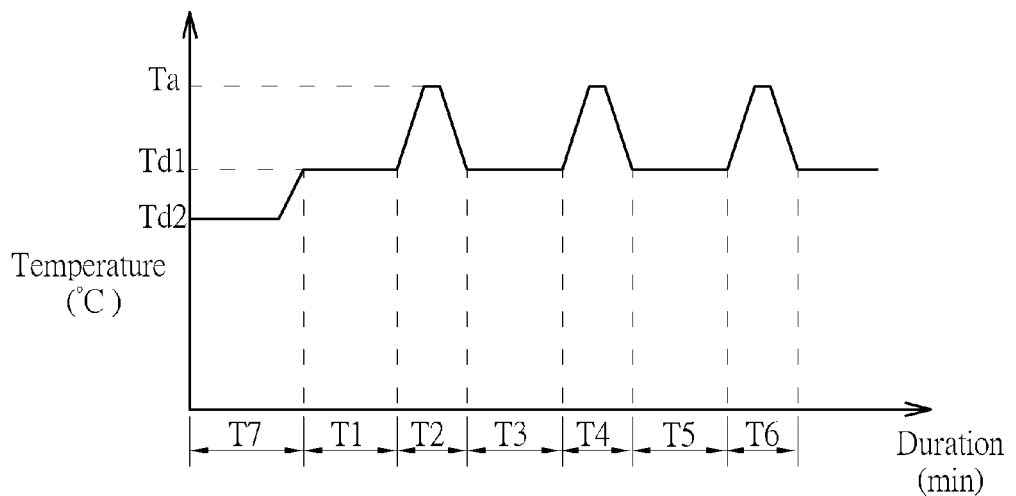
FIG. 2 is a schematic diagram illustrating a relation between a deposition temperature and an annealing temperature according to a preferred embodiment of the present invention.
Figure 3:
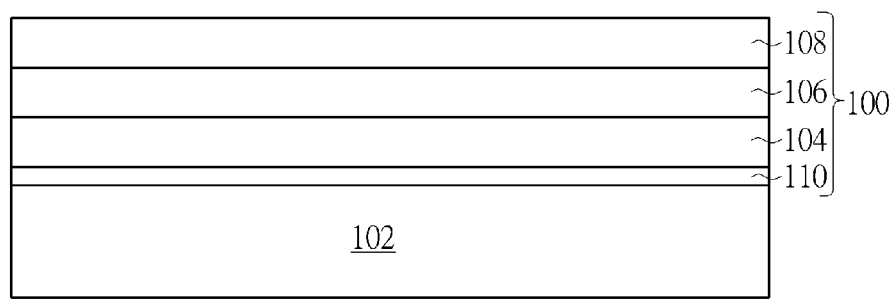
FIG. 3 is a schematic diagram illustrating a cross-sectional view of forming a germanium epitaxial layer on a substrate according to the preferred embodiment of the present invention.

Please refer to FIG. 2 and FIG. 3, and also refer to FIG. 1 together. FIG. 2 is a schematic diagram illustrating a relation between a deposition temperature and an annealing temperature according to a preferred embodiment of the present invention. FIG. 3 is a schematic diagram illustrating a cross-sectional view of forming a germanium epitaxial layer on a substrate according to the preferred embodiment of the present invention. As shown in FIGS. 1-3, Step S10 is performed first to provide a substrate 102. Specifically, the substrate 102 may be placed in a reaction chamber, for example a low pressure vacuum reaction chamber. In this embodiment, a material of the substrate 102 is different from germanium, for example the material of the substrate 102 may include silicon or may be, but not limited to, a silicon epitaxial layer or a silicon-on-insulator (SOI) substrate.

Next, Step S12 is performed to perform a first deposition process to further deposit a first germanium epitaxial film 104 on the substrate 102. The first deposition process may be, but not limited to, an epitaxy process, for example a vapor phase epitaxy process, a metal-organic vapor phase epitaxy process or a molecule-beam epitaxy process. Specifically, in the first deposition process, germanium dioxide ($GeO_2$) gas and hydrogen gas may be introduced into the reaction chamber, and germanium can be reduced by the hydrogen. The first germanium epitaxial film 104 can be formed by depositing the pure germanium on the substrate 102. The method of producing the pure germanium of the present invention is not limited to the above mentioned method, germanium may also be reduced by carbon. In this embodiment, a temperature Td1 of the first deposition process may substantially be 600° C., and a duration T1 of the first deposition process may substantially be in a range from 20 minutes (min) to 80 minutes, but not limited thereto. Since the speed of the epitaxy and the quality of the first germanium epitaxial film 104 are affected by the deposition temperature, the temperature Td1 and the duration T1 of the first deposition process can be modified by the predicted total time for forming a germanium epitaxial layer 100 and the amount of the following deposition processes and annealing processes.

After the first deposition process, Step S14 is performed to perform a first annealing process on the first germanium epitaxial film 104. In this embodiment, the first annealing process is performed after the first deposition process. That is, a temperature in the reaction chamber is not increased to be greater than the temperature Td1 of the first deposition process until the gas is stopped introducing, and the first annealing process is performed on the exposed first germanium epitaxial film 104 in situ. The first germanium epitaxial film 104 is formed on the substrate 102 which material is different from the material of the first germanium epitaxial film 104, so that defects are generated in lattices of the first germanium epitaxial film 104 by the dislocation of the lattices during the epitaxy process. Also, the defects in the lattices of the first germanium epitaxial film 104 can be reduced by the first annealing process. A temperature Ta of the first annealing process may be greater than the temperature Td1 of the first deposition process, the temperature Ta of the first annealing process may be greater than 700° C., preferably 800° C. In addition, the temperature Ta refers to the highest temperature during the first annealing process, and this highest temperature is maintained for a period. In this embodiment, the temperature in the reaction chamber can be lowered to the same temperature of the next deposition process when closing to the end of the first annealing process, so that a duration T2 of the first annealing process is from the stop of the first deposition process to the beginning of the next deposition process. The duration T2 for example may substantially be 1 minute, but not limited thereto. The duration T2 may also be modified according to a thickness of the germanium epitaxial layer 100 required to be formed, the predicted total time for forming the germanium epitaxial layer 100 and the amount of the following deposition processes and annealing processes. In other embodiments, the duration of the first annealing process may not include the time of raising the temperature and the time of lowering the temperature, and the duration of the first annealing process may be the duration of the temperature in the reaction chamber while reaching the annealing temperature of the annealing process, so as to prevent the duration from being affected by the speed of raising the temperature.

Next, Step S16 is performed. Specifically, a second deposition process is performed to deposit a second germanium epitaxial film 106 directly on the first germanium epitaxial film 104. In this embodiment, the second deposition process is performed right after the first annealing process. In other words, the second deposition process is directly performed when the temperature in the reaction chamber is lowered to the temperature Td1 of the second deposition process. The method for forming germanium of the second deposition process and the method for forming germanium of the first deposition process are the same, and will not be redundantly described. In other embodiments, the method for forming germanium of the second deposition process may also be different from that of the first deposition process, for example germanium may be reduced by introducing carbon in the second deposition process. In this embodiment, the temperature Td1 of the second deposition process and the temperature Td1 of the first deposition process may be the same, and a duration T3 of the second deposition process and the duration T1 of the first deposition process may be the same. Thus, a thickness of the second germanium epitaxial film 106 and a thickness of the first germanium epitaxial film 104 are the same, but not limited thereto. In other embodiments, the temperature and the duration of the second deposition process and the temperature and the duration of the first deposition process may be different, and thus the thickness of the second germanium epitaxial film may be different from the thickness of the first germanium epitaxial film.

Next, Step S18 is performed. Specifically, a second annealing process is performed on the second germanium epitaxial film 106. Since the first germanium epitaxial film 104 has been formed at this time, the second germanium epitaxial film 106 and the first germanium epitaxial film 104 are annealed by the second annealing process at the same time. In this embodiment, the second annealing process is performed right after the second deposition process, and a temperature Ta of the second annealing process may be the same as the temperature Ta of the first annealing process, which the temperature Ta may be greater than 700° C., preferably 800° C. In this embodiment, a duration T4 of the second annealing process is from the stop of the second deposition process to the beginning of the next deposition process or the beginning of the cooling. The duration T2 of the first annealing process may be greater than or equal to the duration T4 of the second annealing process, and for example the duration T2 of the first annealing process may substantially be 1 minute, but not limited thereto. It is noteworthy that the first germanium epitaxial film 104 is formed on the substrate 102 first, so that the lattices of the first germanium epitaxial film 104 can be arranged more regularly through extending the duration T2 of the first annealing process to be greater than the duration T4 of the second annealing process, thereby reducing the amount and the density of the defects. Thus, the second germanium epitaxial film 106 formed on the first germanium epitaxial film 104 can be grown on and along the better lattice arrangement of the first germanium epitaxial film 104, and the second germanium epitaxial film 106 can have the better lattice arrangement. In other embodiments, the temperature of the second annealing process may be different from the temperature of the first annealing process.

In this embodiment, a third deposition process and a third annealing process may be optionally performed after the second annealing process, so as to form a third germanium epitaxial film 108, and further form the germanium epitaxial layer 100 having the required thickness. In addition, the stack of the first germanium epitaxial film 104, the second germanium epitaxial film 106 and the third germanium epitaxial film 108 may form the required germanium layer 100 which thickness may be greater than 0.5 micrometers, preferably in a range from 1.5 micrometers to 2.5 micrometers. Specifically, the method for forming germanium, the temperature Td1 and the duration T5 of the third deposition process may be the same as the method for forming germanium, the temperature Td1 and the duration T3 of the second deposition process, and the temperature Ta and the duration T6 of the third annealing process may be the same as the temperature Ta and the duration T4 of the second annealing process, but not limited thereto. In other embodiments, the duration of the third annealing process may also be less than the duration of the second annealing process. In other embodiments, the germanium epitaxial layer is not limited to be formed by the first germanium epitaxial film, the second germanium epitaxial film and the third germanium epitaxial film, and the germanium epitaxial layer may be formed by the first germanium epitaxial film and the second germanium epitaxial film only. In this case, the method for forming the germanium epitaxial layer may only include sequentially performing the first deposition process, the first annealing process, the second deposition process and the second annealing process. In addition, the germanium epitaxial layer may be formed by at least four layers of the germanium epitaxial films. In this case, the method for forming the germanium epitaxial layer may be performing at least four times of the deposition processes and the annealing processes alternately, wherein the deposition processes may be the same or different, and the annealing processes may be the same or different. For example, the durations of the annealing processes may be the same. Or, when the order of one of the annealing processes is later than that of another of the annealing processes, the duration of the one of the annealing processes is smaller than that of another of the annealing processes.

In addition, the manufacturing method in this embodiment further includes cooling the germanium epitaxial layer 100 after the third annealing process, for example cooling the temperature to substantially 600° C.

It is noteworthy that the method for manufacturing the germanium epitaxial layer 100 can effectively reduce the amount and the density of the defects in the germanium epitaxial layer 100 by performing a plurality of the deposition processes and the annealing processes alternately to form the germanium epitaxial layer 100.

In addition, the manufacturing method of this embodiment may further optionally include performing a pre-deposition process before performing the first deposition process, so as to form a seed layer 110 on the substrate 102. The seed layer 110 may be formed of the pure germanium or silicon-germanium, and a thickness of the seed layer 110 may be 0.1 micrometers for example. The manufacturing method of the pre-deposition process and the manufacturing method of the first deposition process may be the same, and will not be redundantly described. Moreover, a duration T7 of the pre-deposition process depends on the thickness of the seed layer 110 required to be formed and a temperature Td2 of the pre-deposition process. It is noteworthy that a width and an arrangement of the lattices of germanium are different from a width and an arrangement of a material (for example silicon) which contacts germanium. Therefore, a lattice dislocation in the interface between germanium and the material which contacts germanium occurs. Moreover, the temperature of the deposition process will affect the growth rate, and the growth rate affects the amount of the lattice defects of germanium in the formed films. Thus, the temperature Td2 of the pre-deposition process may be in a range from 300° C. to 400° C. to reduce the amount of the lattice defects in the formed seed layer 110 as low as possible and to prevent the lattice dislocation of the first germanium epitaxial film 104 from becoming severer. Thereby, the germanium epitaxial layer 100 formed on the seed layer 110 thereafter can have the lower amount of the lattice defects. In other embodiments, an annealing process may be performed between the pre-deposition process and the first deposition process.

Figure 4:
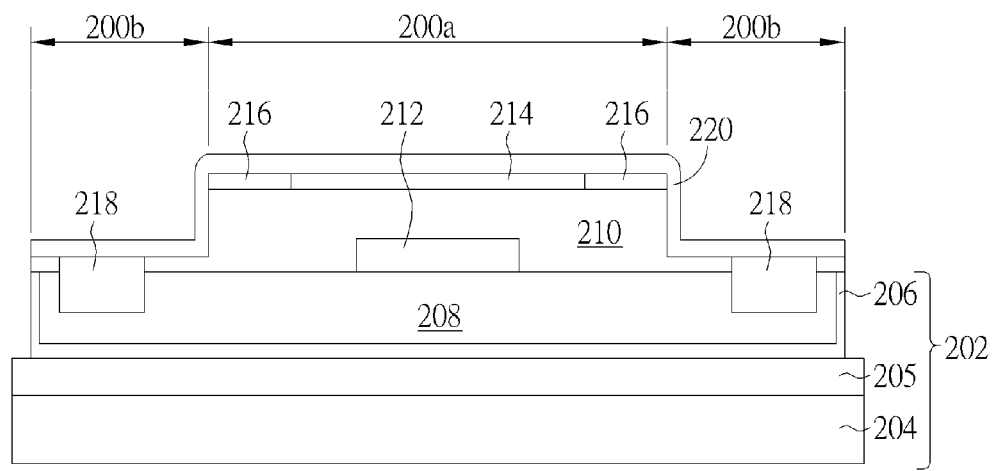
FIGS. 4-6 are schematic diagrams illustrating a method for manufacturing a device according to a preferred embodiment of the present invention.
Figure 5:
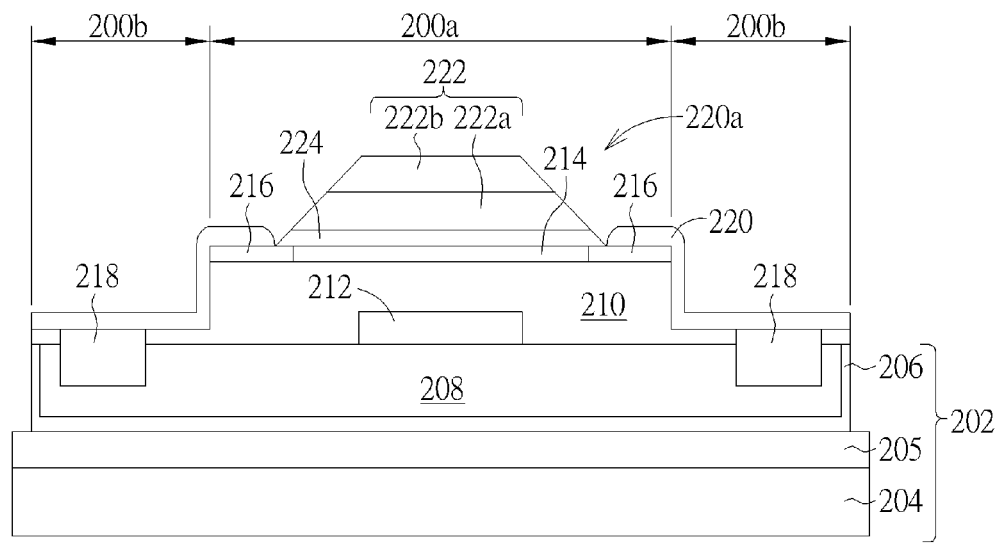
Figure 6:
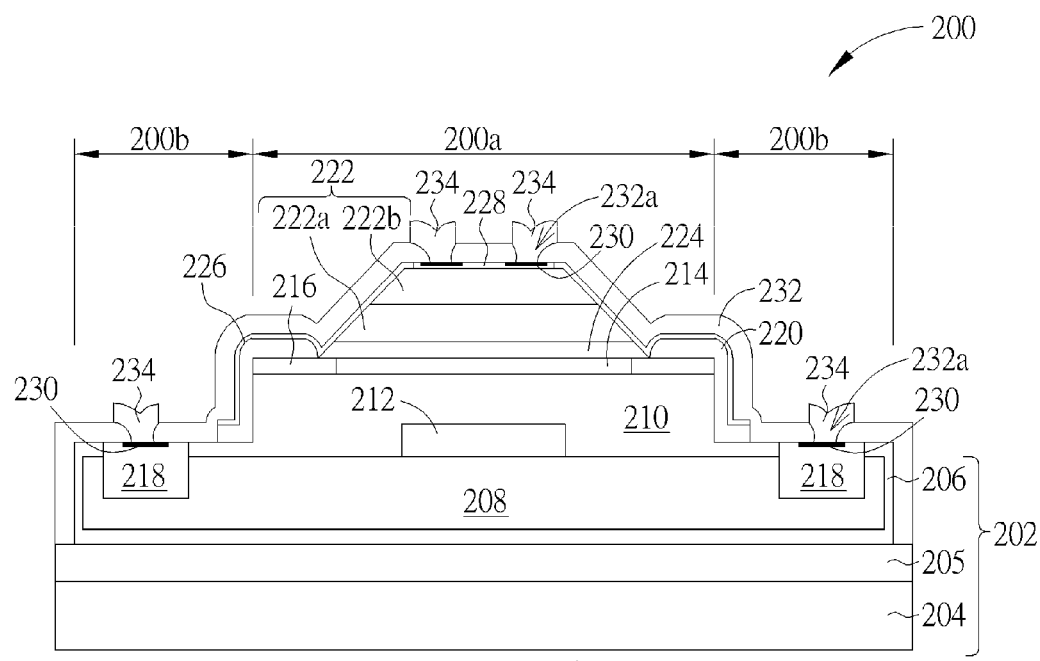

The method for manufacturing germanium epitaxial layer of the present invention can be applied to manufacture a device with the germanium epitaxial layer. An avalanche photodiode (APD) is used as an example in the following mentioned device with germanium epitaxial layer, but not limited thereto. Please refer to FIGS. 4-6. FIGS. 4-6 are schematic diagrams illustrating a method for manufacturing a device according to another preferred embodiment of the present invention. First, as shown in FIG. 4, a substrate 202 is provided. The substrate 202 includes a silicon-on-insulator substrate or a silicon wafer. For example, the silicon-on-insulator substrate may include a silicon wafer 204, an insulating layer 205 and a monocrystalline silicon layer 206 disposed on the insulating layer 205. The insulating layer 205 may be silicon oxide for example. In addition, the monocrystalline silicon layer 206 includes a first doping region 208 with a first conductive type. Next, an epitaxial layer 210 is formed on the monocrystalline silicon layer 206. In this embodiment, a material of the epitaxial layer 210 may be different from germanium. For example, the material of the epitaxial layer 210 may include silicon or may be a silicon epitaxial layer, but not limited thereto. In addition, the manufacturing method of this embodiment may optionally form a fourth doping region 212 with the first conductive type in the epitaxial layer 210, and the fourth doping region 212 contacts the first doping region 208.

Next, a second doping region 214 with a second conductive type and a guard ring 216 surrounding the second doping region 214 are formed in the epitaxial layer 210 corresponding to an absorption region 200a by a mask. The fourth doping region 212 is disposed between the first doping region 208 and the second doping region 214. In this embodiment, the first conductive type is n-type, and the second conductive type is p-type. To clearly describe the conductive type of the first conductive type and the second conductive type respectively, n-type and p-type will be shown directly in the following description. In other embodiments, the n-type doping region may not be formed.

After the p-type second doping region 214 and the p-type guard ring 216 are formed, a portion of the epitaxial layer 210 within a non-absorption region 200b, which does not overlap the p-type second doping region 214 and the p-type guard ring 216, are etched until a surface of the epitaxial layer 210 within the non-absorption region 200b is near the n-type first doping region 208. Next, n-type heavily doped regions 218 are formed within the epitaxial layer 210 in the non-absorption region 200b and the n-type first doping region 208. Then, the epitaxial layer 210 is fully covered with an oxide layer 220, such as a field oxide layer.

As shown in FIG. 5, the oxide layer 220 is patterned to form a first opening 220a, and the first opening 220a exposes a portion of the epitaxial layer 210 within the absorption region 200a. That is, the first opening 220a exposes the p-type second doping region 214 and a portion of the p-type guard ring 216 in the epitaxial layer 210. Next, the method for manufacturing the germanium epitaxial layer of the present invention is performed to form a germanium epitaxial layer 222 on the portion of the epitaxial layer 210 which is exposed by the first opening 220a. A thickness of the germanium epitaxial layer 222 may be greater than 0.5 micrometers, preferably in a range from 1.5 micrometers to 2.5 micrometers.

For example, the steps of forming the germanium epitaxial layer 222 in this embodiment may include performing a first deposition process, a first annealing process, a second deposition process and a second annealing process in sequence to form a first germanium epitaxial film 222a and a second germanium epitaxial film 222b, and the second germanium epitaxial film 222b is stacked on the first germanium epitaxial film 222a. In addition, the steps of forming the germanium epitaxial layer 222 in this embodiment may optionally perform a pre-deposition process before performing the first deposition process to form a seed layer 224 on the epitaxial layer 210. The steps of forming the first germanium epitaxial film 222a, the second germanium epitaxial film 222b and the seed layer 224 may be the same as the above mentioned embodiment, and temperatures and durations of the first deposition process and the second deposition process and temperatures and durations of the first annealing process and the second annealing process may be the same as the above mentioned embodiment, so they will not be redundantly described.

As shown in FIG. 6, a semiconductor layer 226 is formed on the germanium epitaxial layer 222 and the oxide layer 220 after the germanium epitaxial layer 222 is formed, the semiconductor layer 226 may include amorphous silicon or polysilicon for example. A p-type third doping region 228 is then formed in the semiconductor layer 226 on a top surface of the germanium epitaxial layer 222. Next, the oxide layer 220 and the semiconductor layer 226 in the non-absorption region 200b are etched to expose the n-type heavily doped regions 218. Next, silicide metal (silicide) layers 230 are formed on the p-type third doping region 228 and the n-type heavily doped regions 218 respectively. Then, a dielectric layer 232 is formed entirely, and second openings 232a are formed in the dielectric layer 232 to expose the silicide metal layers 230 respectively. Finally, metal connecting pads 234 are formed in the second openings 232a respectively. An avalanche photodiode 200 of this embodiment is then completed.

It is noteworthy that the germanium epitaxial layer 222 of this embodiment is formed by performing a plurality of the deposition processes and the annealing processes alternately. Therefore, the amount and the density of the defects in the germanium epitaxial layer 222 can be reduced. Accordingly, the germanium epitaxial layer 222 which is used as a light absorption layer can have a lower dark current, and further enhance the accuracy of signal detection of the avalanche photodiode 200.

In conclusion, in the method for manufacturing the germanium epitaxial layer of the present invention, the germanium epitaxial layer formed by a plurality of the deposition processes and annealing processes alternately can have lower amount and density of the defects as compared to the germanium epitaxial layer formed by single deposition process and single annealing process. Therefore, the dark current of the avalanche photodiode can be lowered and the accuracy of the detection of the avalanche photodiode can be enhanced when the aforementioned germanium epitaxial layer is applied to the avalanche photodiode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a germanium epitaxial layer, comprising:
   providing a substrate;
   performing a first deposition process to deposit a first germanium epitaxial film on the substrate;
   performing a first annealing process on the first germanium epitaxial film;
   performing a second deposition process to deposit a second germanium epitaxial film directly on the first germanium epitaxial film, wherein a temperature of the first deposition process and a temperature of the second deposition process are the same; and
   performing a second annealing process on the second germanium epitaxial film right after the second deposition process, and a duration of the first annealing process being greater than a duration of the second annealing process, wherein the germanium epitaxial layer comprises the first germanium epitaxial film and the second germanium epitaxial film, and a thickness of the germanium epitaxial layer is greater than 0.5 micrometers.

2. The method for manufacturing the germanium epitaxial layer according to claim 1, wherein a material of the substrate is different from germanium.

3. The method for manufacturing the germanium epitaxial layer according to claim 2, wherein the material of the substrate comprises silicon.

4. The method for manufacturing the germanium epitaxial layer according to claim 1, wherein the thickness of the germanium epitaxial layer is in a range from 1.5 micrometers to 2.5 micrometers.

5. The method for manufacturing the germanium epitaxial layer according to claim 1, further comprising performing a pre-deposition process to deposit a seed layer on the substrate before performing the first deposition process.

6. The method for manufacturing the germanium epitaxial layer according to claim 1, wherein a temperature of the first annealing process and a temperature of the second annealing process are greater than 700° C.

7. The method for manufacturing the germanium epitaxial layer according to claim 1, wherein a temperature of the first annealing process is greater than a temperature of the first deposition process.

8. The method for manufacturing the germanium epitaxial layer according to claim 1, further comprising sequentially performing a third deposition process and a third annealing process after performing the second annealing process, wherein the third deposition process and the third annealing process are performed to form a third germanium epitaxial film, and the germanium epitaxial layer is formed by the first germanium epitaxial film, the second germanium epitaxial film and the third germanium epitaxial film.

9. A method for manufacturing a device, comprising:
   providing a substrate;

forming an epitaxial layer on the substrate;
performing a first deposition process to deposit a first germanium epitaxial film on a portion of the epitaxial layer;
performing a first annealing process on the first germanium epitaxial film;
performing a second deposition process to deposit a second germanium epitaxial film directly on the first germanium epitaxial film, wherein a temperature of the first deposition process and a temperature of the second deposition process are the same; and
performing a second annealing process on the second germanium epitaxial film right after the second deposition process, and a duration of the first annealing process being greater than a duration of the second annealing process, wherein the first germanium epitaxial film and the second germanium epitaxial film form a germanium epitaxial layer, and a thickness of the germanium epitaxial layer is greater than 0.5 micrometers.

10. The method for manufacturing the device according to claim 9, wherein a material of the epitaxial layer is different from germanium.

11. The method for manufacturing the device according to claim 10, wherein the material of the epitaxial layer comprises silicon.

12. The method for manufacturing the device according to claim 9, wherein the thickness of the germanium epitaxial layer is in a range from 1.5 micrometers to 2.5 micrometers.

13. The method for manufacturing the device according to claim 9, further comprising performing a pre-deposition process to deposit a seed layer on the epitaxial layer before performing the first deposition process.

14. The method for manufacturing the device according to claim 9, wherein a temperature of the first annealing process and a temperature of the second annealing process are greater than 700° C.

15. The method for manufacturing the device according to claim 9, wherein a temperature of the first deposition process is less than a temperature of the first annealing process.

16. The method for manufacturing the device according to claim 9, wherein the substrate comprises a silicon-on-insulator substrate.

17. The method for manufacturing the device according to claim 16, wherein the silicon-on-insulator substrate comprises a first doping region with a first conductive type.

18. The method for manufacturing the device according to claim 17, further comprising forming a second doping region with a second conductive type in the epitaxial layer between the step of forming the epitaxial layer and the step of performing the first deposition process.

19. The method for manufacturing the device according to claim 18, further comprising:
forming a semiconductor layer on the germanium epitaxial layer; and
forming a third doping region with the second conductive type in the semiconductor layer.

* * * * *